US006433359B1

(12) United States Patent
Kelley et al.

(10) Patent No.: US 6,433,359 B1
(45) Date of Patent: Aug. 13, 2002

(54) SURFACE MODIFYING LAYERS FOR ORGANIC THIN FILM TRANSISTORS

(75) Inventors: Tommie W. Kelley, Coon Rapids; Dawn V. Muyres, St. Paul; Mark J. Pellerite, Woodbury; Timothy D. Dunbar, Woodbury; Larry D. Boardman, Woodbury; Terrance P. Smith, Woodbury, all of MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/947,845

(22) Filed: Sep. 6, 2001

(51) Int. Cl.$^7$ .............................................. H01L 35/24
(52) U.S. Cl. ............................ 257/40; 257/411; 438/99
(58) Field of Search .......................... 257/40, 410, 411; 438/99, 151, 158

(56) References Cited

U.S. PATENT DOCUMENTS

| 5,079,179 | A |   | 1/1992  | Josefowicz et al. ........... 437/41  |
| 5,347,144 | A |   | 9/1994  | Garnier et al. ................. 257/40 |
| 5,625,199 | A |   | 4/1997  | Baumbach et al. ........... 257/40    |
| 5,965,679 | A |   | 10/1999 | Godschalx et al. .......... 526/281   |
| 6,252,245 | B1 |  | 6/2001  | Katz et al. ..................... 257/40 |
| 6,265,243 | B1 |  | 7/2001  | Katz et al. ..................... 438/99 |
| 6,288,188 | B1 |  | 9/2001  | Godschalx et al. .......... 526/285   |
| 6,326,640 | B1 |  | 12/2001 | Shi et al.                             |
| 6,335,539 | B1 | * | 1/2002  | Dimitrakipoulos et al. ... 257/40    |
| 6,338,988 | B1 | * | 1/2002  | Andry et al. ................. 438/158 |
| 6,351,036 | B1 | * | 2/2002  | Stumborg et al. ........... 257/751   |

FOREIGN PATENT DOCUMENTS

| EP | 1 041 652 A2 | 10/2000 | ........... H01L/51/20 |
| GB | 680343       | 10/1952 |                        |
| WO | WO 99/66540  | 12/1999 |                        |

OTHER PUBLICATIONS

Gao et al., "Self–Assembled Monolayers of Alkylphosphonic Acids on Metal Oxides", *Langmuir*, 12, 1996, pp. 6429–6435.

Gundlach et al., "Pentacene Organic Thin–Film Transistors—Molecular Ordering and Mobility", *IEEE Electron Device Letters*, vol. 18, No. 3, Mar. 1997, pp. 87–90.

Lin et al., "Pentacene–Based Organic Thin Film Transistors", *IEEE Transactions on Electron Devices*, vol. 44, No. 8, Aug. 1997, pp. 1325–1331.

Lin et al., "Stacked Pentacene Layer Organic Thin–Film Transistors with Improved Characteristics", *IEEE Electron Device Letters*, vol. 18, No. 12, Dec. 1997, pp. 606–608.

(List continued on next page.)

*Primary Examiner*—Sara Crane
(74) *Attorney, Agent, or Firm*—Dean M. Harts

(57) ABSTRACT

Provided is an organic thin film transistor comprising a self-assembled monolayer interposed between a gate dielectric and an organic semiconductor layer. The monolayer is a product of a reaction between the gate dielectric and a precursor to the self-assembled monolayer. The monolayer precursor composition has the formula: $X-Y-Z_n$, wherein X is H or $CH_3$; Y is a linear or branched $C_5-C_{50}$ aliphatic or cyclic aliphatic connecting group, or $C_8-C_{50}$ group comprising an aromatic group and a $C_3-C_{44}$ aliphatic or cyclic aliphatic connecting group; Z is selected from from $-PO_3H_2$, $-OPO_3H_2$, benzotriazolyl ($-C_6H_4N_3$), carbonyloxybenzotriazole ($-OC(=O)C_6H_4N_3$), oxybenzotriazole ($-O-C_6H_4N_3$), aminobenzotriazole ($-NH-C_6H_4N_3$), $-CONHOH$, $-COOH$, $-OH$, $-SH$, $-COSH$, $-COSeH$, $-C_5H_4N$, $-SeH$, $-SO_3H$, $-NC$, $-SiCl(CH_3)_2$, $-SiCl_2CH_3$, amino, and phosphinyl; and n is 1, 2, or 3 provided that n=1 when Z is $-SiCl(CH_3)_2$ or $-SiCl_2CH_3$.

Methods of making a thin film transistor and an integrated circuit comprising thin film transistors are also provided.

34 Claims, 1 Drawing Sheet

OTHER PUBLICATIONS

Collet et al., "Performances of Sexithiophene Based Thin-Film Transistor Using Self–Assembled Monolayers", *Mat. Res. Soc. Symp. Proc.*, vol. 488, 1998, pp. 407–412.

Gundlach et al., "Improved Orgainic Thin Film Transistor Performance Using Chemically–Modified Gate Dielectrics", Proc.SPIE, vol. 4466, 2001, pp. 54–64.

Drury et al., "Low–cost all–polymer integrated circuits", *Applied Physics Letters*, vol. 73, No. 1, Jul. 1998, pp. 108–110.

Goetting et al., "Microcontact Printing of Alkanephosphonic Acids on Aluminum: Pattern Transfer by Wet Chemical Etching", *Langmuir*, 15, 1999, pp. 1182–1191.

Klauk et al., "Pentacene Organic Thin–Film Transistors for Circuit and Display Applications", *IEEE Transactions on Electron Devices*, vol. 46, No. 6, Jun. 1999, pp. 1258–1263.

Gundlach et al., "High–Mobility, Low Voltage Organic Thin Film Transistors", 1999 International Electron Devices Meeting Technical Digest, Dec. 1999, pp. 111–114.

Bao, "Materials and Fabrication Needs for Low–Cost Organic Transistor Circuits", *Advanced Materials*, 2000.

Koide et al., "Patterned Luminescence of Organic Light––Emitting Diodes by Hot Microcontact Printing (H$\mu$CP) of Self–Assembled Monolayers", *J. Am. Chem. Soc.*, 122, 2000, pp. 11266–11267.

Tate et al., "Anodization and Microcontact Printing on Electroless Silver: Solution–Based Fabrication Procedures for Low–Voltage Electronic Systems with Organic Active Components", *Langmuir*, 16, 2000, pp. 6054–6060.

Crone et al., "Large–scale complementary integrated circuits based on organic transistors", *Nature*, vol. 403, Feb. 2000, pp. 521–523.

Klauk et al., "Pentacene organic thin–film transistors and ICs", *Solid State Technology*, Mar. 2000, pp. 63–64, 66–67, 72, 75 and 77.

Klauk et al., "A reduced complexity process for organic thin film transistors", *Applied Physics Letters*, vol. 76, No. 13, Mar. 2000, pp. 1692–1693.

Rogers et al., "Organic Smart Pixels and Complementary Inverter Circuits Formed on Plastic Substrates by Casting and Rubber Stamping", *IEEE Electron Devices Letters*, vol. 21, No. 3, Mar. 2000, pp. 100–103.

Kane et al., "Analog and Digital Circuits Using Organic Thin–Film Transistors on Polyerster Substrates", *IEEE Electron Device Letters*, vol. 21, No. 11, Nov. 2000, pp. 534–536.

Marshall, "Welcome to Plastic Valley", *Business 2.0*, Jan. 2001, 3 pages.

Meyer zu Heringdorf et al., "Growth dynamics of pentacene thin films", *Nature*, vol. 412, Aug. 2001, pp. 517–520.

Swiggers et al., "Orientation of pentacene films using surface alignment layers and its influence on thin–film transistor characteristics", *Applied Physics Letters*, vol. 79, No. 9, Aug. 2001, pp. 1300–1302.

Kagan et al., "Patterning orgain–inorganic thin–film transistors using microcontact printed templates", Applied Physics Letters, vol. 79, No. 21, Nov. 2001, pp. 3536–3538.

Sita, "Convenient Highly Stereoselective Syntheses of (3R, 7R,11R)– and (3S,7R,11R)– 3,7,11,15–Tetramethylhexadecanoic Acid (Phytanic Acid) and the Corresponding 3,7,11, 15–Tetramethylhexadecan–1–ols", *J. Org. Chem.*, 58, 1993, pp. 5285–5287.

Braach–Maksvytis et al., "Highly Impermeable "Soft" Self–Assembled Monolayers", *J. Am. Chem. Soc.*, 112, 2000, pp. 9544–9545.

Kosbar et al., "The Effect of Surface Preparation on the Structure and Electrical Transport in an Organic Semiconductor", *Mat. Res. Soc. Symp. Proc.*, vol. 665, 2001, pp. C10.6.1–C10.6.6.

\* cited by examiner

SURFACE MODIFYING LAYERS FOR ORGANIC THIN FILM TRANSISTORS

TECHNICAL FIELD

This invention relates to organic thin film transistors having improved performance. More particularly, the invention relates to organic thin film transistors having a self-assembled monolayer between the semiconductor and gate dielectric.

BACKGROUND

Organic semiconductors are of great interest for a variety of applications centered around low-cost electronics. The view is that organics can be synthesized to incorporate the necessary electronic properties for a wide variety of devices, and also can be constructed to allow low-cost, reel-to-reel processing that is not currently possible for crystalline silicon microelectronics.

One area of concern in organic electronic devices is the quality of the interface formed between the organic semiconductor and another device layer. Much work has been done to control the nature of metal contacts to organic semiconductors using self-assembled monolayers (SAMs) and other types of "doped" contacts. Previous efforts to control the semiconductor/dielectric interface have included the use of hexamethyldisilazane (HMDS) and silane coupling agents on silicon oxide surfaces. Complex deposition processes involving long times in a vacuum have been used to coat octadecyltrichlorosilane (OTS) onto thermally-grown silicon dioxide gate dielectric materials to affect transistor performance. The materials useful in this process have several disadvantages, including sensitivity to water in the atmosphere and on the surface of a dielectric layer, instability due to crosslinking within the material in competition with the bonding reaction to the dielectric layer, and difficulties in achieving reproducible film properties. EP 1041652 A2 describes the use of several surface treatments to enhance the crystalline domain size of solution cast oligothiophenes on $SiO_X$ for thin film transistors (TFTs), although measured mobility values were generally lower than the untreated controls.

SUMMARY

The present inventors investigated organic electronic devices, and focused on the interface between the organic semiconductor and the dielectric material. They discovered materials and methods of improving the properties of organic thin film transistors. The organic thin film transistors of the invention also are suitable for manufacturing via roll-to-roll processing.

Briefly, the present invention provides a self-assembled monolayer interposed between a gate dielectric and an organic semiconductor layer, the monolayer being a product of a reaction between the gate dielectric and a precursor to the self-assembled monolayer, the precursor comprising a composition having the formula:

$$X-Y-Z_n,$$

wherein X is H or $CH_3$;

Y is a linear or branched $C_5-C_{50}$ aliphatic or cyclic aliphatic connecting group, or a linear or branched $C_8-C_{50}$ group comprising an aromatic group and a $C_3-C_{44}$ aliphatic or cyclic aliphatic connecting group;

Z is selected from $—PO_3H_2$, $—OPO_3H_2$, benzotriazolyl  , carbonyloxybenzotriazole (—OC(=O) $C_6H_4N_3$), oxybenzotriazole (—O—$C_6H_4N_3$), aminobenzotriazole (—NH—$C_6H_4N_3$), —CONHOH, —COOH, —OH, —SH, —COSH, —COSeH, —$C_5H_4N$, —SeH, —$SO_3H$, —NC, —$SiCl(CH_3)_2$, —$SiCl_2CH_3$, amino, and phosphinyl;

and n is 1, 2, or 3 provided that n=1 when Z is —SiCl$(CH_3)_2$ or —$SiCl_2CH_3$.

Various thin film transistor construction options are possible. For example, the source and drain electrodes may be adjacent to the gate dielectric with the organic semiconductor layer over the source and drain electrodes, or the organic semiconductor layer may be interposed between the source and drain electrodes and the gate dielectric.

In another aspect, the present invention provides a method of making a thin film transistor comprising the steps of providing a substrate, providing a gate electrode material on the substrate, providing a gate dielectric on the gate electrode material, providing a self-assembled monolayer (SAM) adjacent to the gate dielectric, the monolayer being a product of a reaction between the gate dielectric and a precursor to the self-assembled monolayer, providing an organic semiconductor layer adjacent to the monolayer, and providing a source electrode and a drain electrode contiguous to the organic semiconductor layer. The precursor is as described above with the organic thin film transistor article. An integrated circuit comprising organic thin film transistor articles is also provided.

It is an advantage of the present invention to provide organic thin film transistors with one or more improvements over known devices that lack the features of the present invention. With the invention, improvements in properties such as threshold voltage, subthreshold slope, on/off ratio, and charge-carrier mobility can be achieved. The improvements in device performance provided by the present invention enable the production of more complicated circuits having faster switching speeds and simpler processing conditions. This invention also enables the production of larger circuit elements having comparable performance to devices with very small features. Devices with larger feature sizes can be less expensive as they do not require expensive precision patterning methods.

As used herein, "a" or "an" or "the" are used interchangeably with "at least one", to mean "one or more" of the element being modified.

Other features and advantages of the invention will be apparent from the following detailed description of the invention and the claims. The above summary of principles of the disclosure is not intended to describe each illustrated embodiment or every implementation of the present disclosure. The figures and the detailed description that follow more particularly exemplify certain preferred embodiments utilizing the principles disclosed herein.

DETAILED DESCRIPTION

Generally, a thin film transistor includes a gate electrode, a gate dielectric on the gate electrode, a source electrode and a drain electrode adjacent to the gate dielectric, and a semiconductor layer adjacent to the gate dielectric and adjacent to the source and drain electrodes. More specifically, an organic thin film transistor (OTFT) has an organic semiconductor layer.

The organic thin film transistor of the present invention further includes a self-assembled monolayer (SAM) interposed between the gate dielectric and the organic semiconductor layer.

Figure 1:
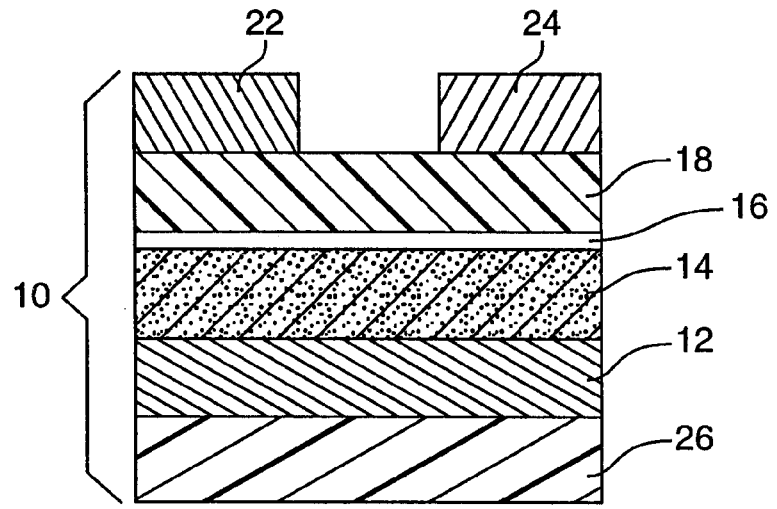
FIG. 1 is a schematic cross-sectional view, not to scale, of one embodiment of the present invention.

Referring now to FIG. 1, in one embodiment of the present invention gate electrode 12 is provided on substrate 26. Gate dielectric 14 is provided on gate electrode 12. Self-assembled monolayer 16 is interposed between gate dielectric 14 and organic semiconductor layer 18. Source electrode 22 and drain electrode 24 are provided adjacent to organic semiconductor layer 18.

The transistor embodiment described above includes the source and drain electrodes on the organic semiconductor layer. Various other embodiments are within the scope of the present invention, some of which are described below.

Figure 2:
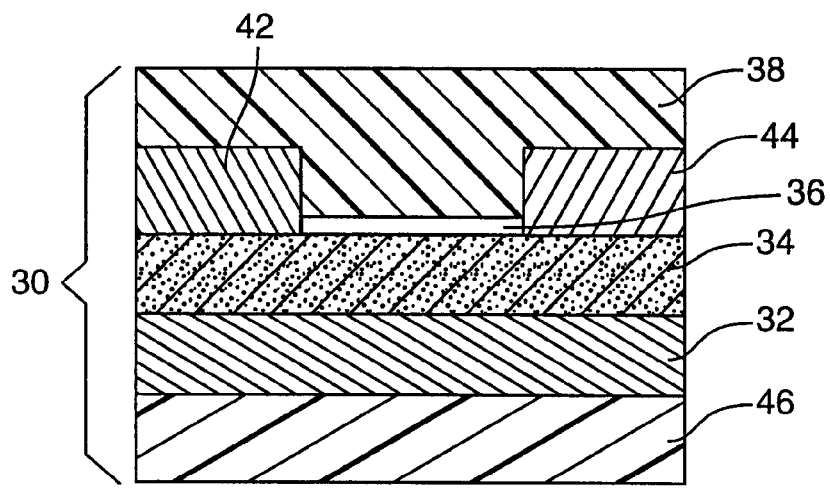
FIG. 2 is a schematic cross-sectional view, not to scale, of another embodiment of the present invention.

Referring now to FIG. 2, in another embodiment of the present invention gate electrode 32 is provided on substrate 46. Gate dielectric 34 is provided on gate electrode 32. Source electrode 42 and drain electrode 44 are located adjacent to gate dielectric 34. Self-assembled monolayer 36 is interposed between gate dielectric 34 and organic semiconductor layer 38.

Figure 3:
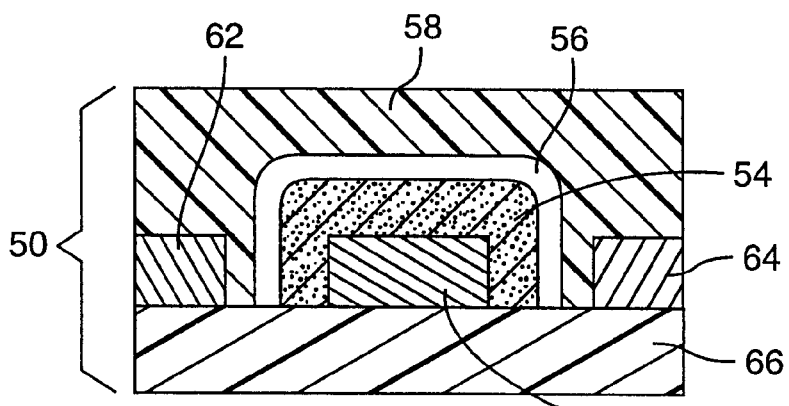
FIG. 3 is a schematic cross-sectional view, not to scale, of yet another embodiment of the present invention.

Referring now to FIG. 3, in yet another embodiment of the present invention gate electrode 52, source electrode 62, and drain electrode 64 are provided on substrate 66. Gate dielectric 54 is provided on gate electrode 52. Self-assembled monolayer 56 is interposed between gate dielectric 54 and organic semiconductor layer 58. Gate dielectric 54 should enclose gate electrode 52 such that gate electrode 52 is electrically insulated from source electrode 62 and drain electrode 64. Gate dielectric 54 may not fill the entire region between gate electrode 52 and source electrode 62 and/or drain electrode 64, although gate electrode 52 should be enclosed by gate dielectric 54. In such a case, self-assembled monolayer 56 and/or organic semiconductor layer 58 may be included in the region between gate dielectric 54 and source electrode 62 and/or drain electrode 64.

The substrate supports the OTFT during manufacturing, testing, and/or use. For example, one substrate may be selected for testing or screening various embodiments while another substrate is selected for commercial embodiments. In some embodiments, the substrate does not provide any necessary electrical function for the TFT. This type of substrate is termed a "non-participating substrate" in this document. Useful materials can include organic or inorganic materials. For example, the substrate may comprise inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS), and fiber-reinforced plastics (FRP).

A flexible substrate is used in some embodiments of the present invention. This allows for roll processing, which may be continuous, providing economy of scale and economy of manufacturing over flat and/or rigid substrates. The flexible substrate chosen preferably is capable of wrapping around the circumference of a cylinder of less than about 50 cm diameter without distorting or breaking. The substrate chosen more preferably is capable of wrapping around the circumference of a cylinder of less than about 25 cm diameter without distorting or breaking the substrate. In some embodiments, the substrate chosen most preferably is capable of wrapping around the circumference of a cylinder of less than about 10 cm diameter, or even about 5 cm diameter, without distorting or breaking the substrate. The force used to wrap the flexible substrate of the invention around a particular cylinder typically is low, such as by unassisted hand, i.e., without the aid of levers, machines, hydraulics, and the like. The preferred flexible substrate may be rolled upon itself.

In some embodiments of the invention, the substrate is optional. For example, in the embodiment of FIG. 1, when gate electrode 12 and/or gate dielectric 14 provide sufficient support for the intended use of the resultant TFT, substrate 26 is not required. In addition, the substrate may be combined with a temporary support. In such an embodiment, a support may be detachably adhered or mechanically affixed to substrate 26, such as when the support is desired for a temporary purpose, e.g., manufacturing, transport, testing, and/or storage. For example, a flexible polymeric substrate may be adhered to a rigid glass support, which support could be removed.

The gate electrode can be any useful conductive material. For example, the gate electrode may comprise doped silicon, or a metal, such as aluminum, chromium, gold, silver, nickel, palladium, platinum, tantalum, and titanium. Conductive polymers also can be used, for example polyaniline, poly(3,4-ethylenedioxythiophene)/poly(styrene sulfonate) (PEDOT:PSS). In addition, alloys, combinations, and multilayers of these materials may be useful.

In some embodiments of the invention, the same material can provide the gate electrode function and also provide the support function of the substrate. For example, doped silicon can function as the gate electrode and support the OTFT.

The gate dielectric is provided on the gate electrode. This gate dielectric electrically insulates the gate electrode from the balance of the OTFT device. Thus, the gate dielectric comprises an electrically insulating material. The gate dielectric should have a dielectric constant above about 2, more preferably above about 5. The dielectric constant of the gate dielectric also can be very high, for example, 80 to 100 or even higher. Useful materials for the gate dielectric may comprise, for example, an inorganic electrically insulating material. The gate dielectric may comprise a polymeric material, such as polyvinylidenedifluoride (PVDF), cyanocelluloses, polyimides, etc., although an inorganic capping layer preferably comprises the outer layer for bonding to the self-assembled monolayer.

Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these examples can be used for the gate dielectric. Of these materials, aluminum oxides, silicon oxides, and zinc selenide are preferred.

The gate dielectric can be provided in the OTFT as a separate layer, or formed on the gate such as by oxidizing the gate material to form the gate dielectric.

The source electrode and drain electrode are separated from the gate electrode by the gate dielectric, while the organic semiconductor layer can be over or under the source electrode and drain electrode. The source and drain electrodes can be any useful conductive material. Useful materials include most of those materials described above for the gate electrode, for example, aluminum, barium, calcium, chromium, gold, silver, nickel, palladium, platinum, titanium, polyaniline, PEDOT:PSS, other conducting polymers, alloys thereof, combinations thereof, and multilayers thereof.

The thin film electrodes (e.g., gate electrode, source electrode, and drain electrode) can be provided by any useful means such as physical vapor deposition (e.g., thermal evaporation, sputtering) or ink jet printing. The patterning of these electrodes can be accomplished by known methods such as shadow masking, additive photolithography, subtractive photolithography, printing, microcontact printing, and pattern coating.

Useful materials for the organic semiconductor layer include acenes. Particular examples include anthracene, naphthalene, tetracene, and pentacene. Other examples include perylenes, fullerenes, phthalocyanines, oligothiophenes, and substituted derivatives thereof.

The organic semiconductor layer can be provided by any useful means, such as for example, vapor deposition, spin coating, and printing techniques.

The self-assembled monolayer (SAM) is interposed between the gate dielectric and the organic semiconductor layer. The monolayer is a product of a reaction between the gate dielectric and a precursor to the self-assembled monolayer.

Self-assembled monolayer precursors provide molecules that form self-assembled films, typically, monolayer films on the target surface. Self-assembled thin films are often prepared by coating a substrate of interest in a dilute solution of the self-assembling precursor or by exposure to a vapor phase containing the precursor, and allowing film formation to proceed. The precursor molecules form a generally organized molecular film on the substrate. Once formed, the film does not redissolve in the solvent from which it was deposited.

Generally, materials that form crosslinks independently of monolayer formation which may be in competition with the adsorption or bonding reaction to the gate dielectric, such as trifunctional silanes, are not desired for the monolayer precursor of the present invention. However, materials that have functional groups effective to bond to the gate dielectric and have other groups that may form crosslinks after formation of the SAM can be used.

The monolayer precursor comprises a composition having the formula:

wherein X is H or $CH_3$;
Y is a linear or branched $C_5$–$C_{50}$ aliphatic or cyclic aliphatic connecting group, or a linear or branched $C_8$–$C_{50}$ group comprising an aromatic group and a $C_3$–$C_{44}$ aliphatic or cyclic aliphatic connecting group;
Z is selected from —$PO_3H_2$, —$OPO_3H_2$, benzotriazolyl (—$C_6H_4N_3$), carbonyloxybenzotriazole (—OC(=O)$C_6H_4N_3$), oxybenzotriazole (—O—$C_6H_4N_3$), aminobenzotriazole (—NH—$C_6H_4N_3$), —CONHOH, —COOH, —OH, —SH, —COSH, —COSeH, —$C_5H_4N$, —SeH, —$SO_3H$, isonitrile (—NC), chlorodimethylsilyl (—$SiCl(CH_3)_2$), dichloromethylsilyl (—$SiCl_2CH_3$), amino, and phosphinyl;
and n is 1, 2, or 3 provided that n=1 when Z is —SiCl$(CH_3)_2$ or —$SiCl_2CH_3$.

Herein, the reaction between any gate dielectric and a functional group within the self-assembled monolayer precursor is preferably a bonding interaction (e.g. covalent or ionic). Herein, a self-assembled monolayer refers to a monomolecular layer on the order of about 5 Angstroms (Å) to about 30 Å thick.

In preferred embodiments, Y can be a saturated aliphatic group, an unsaturated aliphatic group, a saturated cyclic aliphatic group, and an unsaturated cyclic aliphatic group, or a combination thereof, each of which may be linear or branched.

The monolayer precursor may comprise a composition of the formula:

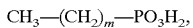

wherein m is an integer from 4 to 21.

Particular examples for the monolayer precursor include 1-phosphonooctane, 1-phosphonohexane, 1-phosphonohexadecane, and 1-phosphono-3,7,11,15-tetramethylhexadecane.

One member of a class of branched hydrocarbon monolayer precursors useful in the practice of the present invention is 1-phosphono-3,7,11,15-tetramethylhexadecane. Other members of this class include 1-phosphono-2-ethylhexane, 1-phosphono-2,4,4-trimethylpentane, and 1-phosphono-3,5,5-trimethylhexane. The 1-phosphono-3,7,11,15-tetramethylhexadecane can be prepared from a commercially available allylic alcohol precursor by reduction of the alkene double bond, conversion of the alcohol to the corresponding bromide, and then conversion of the bromide to the corresponding phosphonic acid. More specifically, 1-phosphono-3,7,11,15-tetramethylhexadecane can be obtained by reducing 3,7,11,15-tetramethyl-2-hexadecen-1-ol to 3,7,11,15-tetramethyl-1-hexadecanol, converting the 3,7,11,15-tetramethyl-1-hexadecanol to 1-bromo-3,7,11,15-tetramethylhexadecane, and then converting the 1-bromo-3,7,11,15-tetramethylhexadecane to 1-phosphono-3,7,11,15-tetramethylhexadecane. These synthetic transformations are accomplished using materials and methods familiar to those skilled in the art. Starting materials other than 3,7,11,15-tetramethyl-2-hexadecen-1-ol and individual reaction sequences other than that described above may also be used to synthesize 1-phosphono-3,7,11,15-tetramethylhexadecane, as well as other members of this class of branched hydrocarbon monolayer precursors, and the specifically exemplified monolayer precursor and method of preparation should not be construed as unduly limiting.

The self-assembled monolayer precursor is provided on the gate dielectric by any known method. For example, the precursor can be provided through a coating process such as spray, spin, dip, gravure, microcontact printing, ink jet printing, stamping, transfer printing, and vapor deposition. The self-assembled monolayer precursor is allowed to interact with the gate dielectric surface. The interaction or reaction may be instantaneous or may require time, in which case increasing the temperature can reduce the necessary time. When a solution of the self-assembled monolayer precursor is provided on the gate dielectric layer, the solvent is removed by a method compatible with the materials involved, for example by heating. Any excess monolayer precursor is typically rinsed away before deposition of the organic semiconductor.

In one embodiment, the source and drain electrodes are provided adjacent to the gate dielectric before providing the monolayer precursor. Then, the monolayer precursor is provided. After the self-assembled monolayer is complete, the organic semiconductor layer is provided over the source and drain electrodes and over the self-assembled monolayer adjacent to the gate dielectric.

The organic thin film transistor (OTFT) of the present invention has one or more advantages over known organic thin film transistors. These advantages are apparent, for example, in charge-carrier mobility. The present invention provides OTFTs having a charge-carrier mobility better than a comparison OTFT not made according to the present invention and lacking the inventive self-assembled monolayer. The OTFTs of the invention preferably have a charge-carrier mobility of at least about 25% better, more preferably at least about 50% better, and in some embodiments at least about 100% better, than the charge-carrier mobility of a comparison OTFT not made according to the present invention. Such improvements in charge-carrier mobility are provided while maintaining other OTFT properties within desirable ranges. For example, the above-described improvements are obtained while providing a threshold voltage between about 25 and −25 V, a subthreshold slope below about 10 V/decade (absolute value), an on/off ratio of at least about $10^4$.

More specifically, in an embodiment having pentacene as the organic semiconductor, the invention provides an OTFT with a charge-carrier mobility at least about 0.2 $cm^2/Vs$, more preferably at least 0.5 $cm^2/Vs$, and even more preferably at least about 1.0 $cm^2/Vs$. In some embodiments of the present invention, the charge-carrier mobility is above 2.0 $cm^2/Vs$.

The invention provides a p-type semiconductor OTFT having a threshold voltage of between about −25 and 25 V, preferably a threshold voltage of between about 0 and −10 V, more preferably between about 0 and −5 V. The invention provides an n-type semiconductor OTFT having a threshold voltage of between about −25 and 25 V, preferably a threshold voltage of between about 10 and 0 V, more preferably between about 5 and 0 V.

The invention provides an OTFT with a subthreshold slope below about 10 V/decade (absolute value), preferably a subthreshold slope below about 5 V/decade (absolute value), more preferably below about 2 V/decade (absolute value). The invention provides an OTFT with an on/off ratio of at least about $10^4$, preferably at least about $10^5$, more preferably at least about $5\times10^5$, and even more preferably at least about $10^6$.

Various combinations of these properties are possible. For example, in one embodiment of the invention, the p-type semiconductor OTFT has a charge-carrier mobility of at least about 1 $cm^2/Vs$, a negative threshold voltage, a subthreshold slope below about 5 V/decade, and an on/off ratio at least about $10^5$.

The present invention also provides a method of making a thin film transistor comprising the steps of: (a) providing a substrate; (b) providing a gate electrode material on the substrate; (c) providing a gate dielectric on the gate electrode material; (d) providing a self-assembled monolayer (SAM) adjacent to the gate dielectric, the monolayer being a product of a reaction between the gate dielectric and a precursor to the self-assembled monolayer, the precursor comprising a composition having the formula X—Y—$Z_n$, wherein X is H or $CH_3$; Y is a linear or branched $C_5$–$C_{50}$ aliphatic or cyclic aliphatic connecting group, or a linear or branched $C_8$–$C_{50}$ group comprising an aromatic group and a $C_3$–$C_{44}$ aliphatic or cyclic aliphatic connecting group; Z is selected from —$PO_3H_2$, —$OPO_3H_2$, benzotriazolyl (—$C_6H_4N_3$), carbonyloxybenzotriazole (—OC(=O) $C_6H_4N_3$), oxybenzotriazole (—O—$C_6H_4N_3$), aminobenzotriazole (—NH—$C_6H_4N_3$), —CONHOH, —COOH, —OH, —SH, —COSH, —COSeH, —$C_5H_4N$, —SeH, —$SO_3H$, —NC, —$SiCl(CH_3)_2$, —$SiCl_2CH_3$, amino, and phosphinyl; and n is 1, 2, or 3 provided that n=1 when Z is —$SiCl(CH_3)_2$ or —$SiCl_2CH_3$; (e) providing an organic semiconductor layer adjacent to the monolayer; and (f) providing a source electrode and a drain electrode contiguous to the organic semiconductor layer.

The organic semiconductor layer can be provided over or under the source and drain electrodes, as described above in reference to the thin film transistor article. The present invention also provides an integrated circuit comprising a plurality of OTFTs made by the process described above.

The present invention further provides a method of making an integrated circuit comprising providing a plurality of OTFTs as described above. Thus, the present invention is embodied in an article that comprises one or more of the OTFTs described. Such articles include, for example, radio-frequency identification tags, backplanes for active matrix displays, smart cards, memory devices, and the like. In devices containing the OTFTs of the present invention, such OTFTs are operatively connected by means known in the art.

The entire process of making the thin film transistor or integrated circuit of the present invention can be carried out below a maximum substrate temperature of about 450° C., preferably below about 250° C., more preferably below about 150° C., and even more preferably below about 70° C., or even at temperatures around room temperature (about 25° C.). The temperature selection generally depends on the substrate and processing parameters known in the art, once one is armed with the knowledge of the present invention contained herein. These temperatures are well below traditional integrated circuit and semiconductor processing temperatures, which enables the use of any of a variety of relatively inexpensive substrates, such as flexible polymeric substrates. Thus, the invention enables production of relatively inexpensive integrated circuits containing organic thin film transistors with significantly improved performance.

Objects and advantages of this invention are further illustrated by the following examples, but the particular materials and amounts thereof recited in these examples, as well as other conditions and details, should not be construed to unduly limit this invention.

EXAMPLES

Test Methods

A. Film Thickness

Single wavelength ellipsometry was employed to obtain estimates of surface treatment organic film thickness. Substrate values of Psi and Delta ($\psi_s$ and $\Delta_s$) were obtained from the cleaned substrates at an angle of incidence of 70° and a wavelength of 632.8 nm using a Gaertner Dual Mode Automatic Ellipsometer, model L116A (Gaertner Co., Skokie, Ill.). The film was applied to the substrates, and film values were measured ($\psi_f$ and $\Delta_f$).

Ellipsometry modeling software, WVASE32 (from J. A. Woollam, Inc., Lincoln, Nebr.) was used to construct an optical model consisting of 1500 Å $Al_2O_3$ on 10 Å $SiO_2$ on Si. Typical optical constants (included with the software) were employed for the $SiO_2$ and Si layers. The floating variables in the fit were the thickness (d) and refractive index (n) of the $Al_2O_3$. Seed values of 1500 Å and n=1.77 were used. Typical final fit values were between 1400 Å and 1700 Å with n between 1.56 and 1.60.

Once $\psi_s$ and $\Delta_s$ were fit, the floating variables ($d_{Al2O3}$ and $n_{Al2O3}$) were then fixed. An organic layer was added to the optical model, between the air and dielectric layers. This layer had a variable thickness, but its refractive index was fixed at 1.46. The organic layer thickness was then varied to achieve the best fit to $\psi_f$ and $\Delta_f$. This organic layer thickness was reported as the thickness of the self-assembled monolayer.

For more information see Laibinis, et al., "Comparison of the structures and wetting properties of self-assembled monolayers of normal-alkanethiols on the coinage metal surfaces, Cu, Ag, Au", *J Am. Chem. Soc.*, Vol. 113, pages 7152–67, 1991.

B. Water Contact Angle (WCA)

Static, advancing, and receding water contact angles were measured with a video contact angle apparatus (Model VCA-2500XE, from AST Products, Billerica, Mass.). Values reported were averages of measurements on both sides of at least three drops on each tested surface. Estimated uncertainties on these measurements were +/−1 degree on static and advancing measurements and +/−2 degrees on receding measurements. Surface characterization data are summarized in Table I.

C. Self-Assembled Monolayer Quality

The structure and ordering of the monolayers were determined using both contact angle and ellipsometric thickness data with techniques reported, e.g., by Bain, et al., in *J. Am. Chem. Soc.*, Vol. 111, pages 321–35, 1989. According to this method, when advancing water contact angle values were between 111 and 115° and receding angles were greater than 100°, a well-ordered methyl terminated surface was likely responsible. When the ellipsometric thickness was about 70 to 100% of the calculated length of the molecule (i.e., about 18 to 19 Å for 1-phosphonohexadecane), the phosphonoalkane molecules likely were oriented largely normal to the surface with their methyl (—$CH_3$) groups at the air/phosphonoalkane film interface and their phosphono groups at the phosphonoalkane film/dielectric interface. Conversely, advancing water contact angles between 100 and 110° indicated a film with less ordering of the alkane chains, suggesting that the air/phosphonoalkane film interface was composed of methylene (—$CH_2$—) as well as methyl groups.

D. Thin Film Transistor Performance

Transistor performance was tested at room temperature in air using techniques known in the art, for example as shown in S. M. Sze, *Physics of Semiconductor Devices*, page 442, John Wiley & Sons, New York, 1981, which is herein incorporated by reference. A Semiconductor Parameter Analyzer (model 4145A from Hewlett-Packard, San Jose, Calif.) was used for the results below.

The square root of the drain current ($I_d$) was plotted as a function of gate-source bias ($V_g$, from +10V to −40V for a constant source-drain bias ($V_d$) of −40V, and the saturation field effect mobility was calculated from the straight line portion of the curve using the specific capacitance of the gate dielectric, the channel width and the channel length. The x-axis extrapolation of this straight-line fit was taken as the threshold voltage ($V_t$). In addition, plotting $I_d$ as a function of $V_g$ yielded a curve where a straight line fit was drawn along a portion of the curve containing $V_t$. The inverse of the slope of this line was the subthreshold slope (S). The on-off ratio was taken as the difference between the minimum and maximum values of the $I_d$-$V_g$ curve.

Materials

Precursors

The self-assembled monolayer precursor 1-phosphonohexadecane ($CH_3$—$(CH_2)_{15}$—$PO_3H_2$) was commercially available from Oryza Laboratories, Chelmsford, Mass., 1-phosphonooctane ($CH_3$—$(CH_2)_7$—$PO_3H_2$) was commercially available from Alfa Aesar, Ward Hill, Mass., and the 1-phosphonohexane was commercially available from Organometallics, Inc., East Hampstead, N.H.

In those instances where the phosphonic acid as received contained residual ethyl esters, the materials were purified by hydrolysis of residual ester in aqueous hydrochloric acid at 100° C. followed by recrystallization of the phosphonic acid from heptane or methanol using procedures known to those skilled in the art.

The 1-phosphono-3,7,11,15-tetramethylhexadecane ($CH_3$—$(CHCH_3CH_2CH_2CH_2)_3CHCH_3CH_2CH_2$—$PO_3H_2$) self-assembled monolayer was synthesized according to the following method. The materials were all commercially available, e.g., from Aldrich Chemicals, Milwaukee, Wis.

To a solution of 50.0 g (169 mmol) of 3,7,11,15-tetramethyl-2-hexadecen-1-ol in 200 mL of ethanol were added 0.3 g (3 mmol) of triethylamine and 500 mg of 5% Pd on carbon. The mixture was maintained under 50 psi (345 kPa) of hydrogen on a Parr hydrogenator for 24 h. The mixture was filtered and concentrated, and distillation afforded 41.7 g (83%) of 3,7,11,15-tetramethyl-1-hexadecanol as a clear, colorless liquid, bp 150–155° C. at 0.05 mm Hg.

To a mixture of 40.0 g (134 mmol) of 3,7,11,15-tetramethyl-1-hexadecanol and 400 mL of 48% hydrobromic acid was slowly added 40 mL of concentrated sulfuric acid. The reaction mixture was heated at 100° C. for 24 h and poured into 1.2 L of water. The mixture was extracted with hexanes, and the combined organic phases were washed with saturated aqueous $NaHCO_3$ and dried over $MgSO_4$. The solution was concentrated to a dark liquid, which was eluted through 3 inches (7.6 cm) of silica with hexanes. Concentration of the eluent yielded a light amber liquid, and bulb-to-bulb distillation gave 40.8 g (84%) of 1-bromo-3,7,11,15-tetramethylhexadecane as a clear, colorless liquid, bp 160–180° C. at 0.06 mm Hg.

A mixture of 21.69 g (60 mmol) of 1-bromo-3,7,11,15-tetramethylhexadecane and 25 g (150 mmol) of triethyl phosphite was heated at 150° C. After 18 h, an additional 20 g (120 mmol) of triethyl phosphite was added, and heating was continued for 24 h. Diethyl ethylphosphonate and other volatiles were distilled, bp 30–50° C. at 0.05 mm Hg, and bulb-to-bulb distillation of the concentrate provided 23.51 g (94%) of 1-(diethylphosphono)-3,7,11,15-tetramethylhexadecane as a clear, colorless liquid, bp 190–230° C. at 0.05 mm Hg.

To a solution of 14.6 g (35 mmol) of 1-(diethylphosphono)-3,7,11,15-tetramethylhexadecane in 40 mL of dichloromethane was added 15.0 g (98 mmol) of bromotrimethylsilane. After 24 h at room temperature, the solution was concentrated to a pale yellowish liquid, and the intermediate silylphosphonate ester was dissolved in 100 mL of methanol. The resultant solution was stirred at room temperature for 30 min and concentrated to a white solid. Dissolution in methanol and concentration were repeated two times, and recrystallization from ethyl acetate afforded 10.5 g (83%) of 1-phosphono-3,7,11,15-tetramethylhexadecane as white crystals, mp 69–72° C.

The $^1H$, $^{13}C$, and $^{31}P$ NMR spectra of the final product and all intermediates were consistent with the structures of the target compounds.

Substrates

Single crystal <100> orientation silicon wafers were obtained from Silicon Valley Microelectronics, San Jose, Calif. A 1500 Å layer of alumina was deposited on each wafer front via chemical vapor deposition methods. A 5000 Å layer of aluminum metal was vapor deposited onto the backside of each wafer. In this demonstration, the doped wafer capped with aluminum served as the gate electrode and the aluminum oxide functioned as the gate dielectric when organic thin film transistors were prepared.

EXAMPLE 1

A silicon wafer substrate described above was quartered and cleaned using a 5-minute exposure in a UV/ozone chamber (home-built, short-wavelength UV). The selected self-assembled monolayer precursor (1-phosphonohexadecane) was applied to the alumina surface of the prepared substrate by spin coating a 0.1 weight percent (wt %) solution of the precursor in absolute ethanol at 300 rpm for 5 seconds followed by 2000 rpm for 15 seconds. The coated substrate was then heated at 150° C. for 3 min on a vacuum hotplate, then rinsed in fresh ethanol and dried under a nitrogen stream. The result was a self-assembled monolayer on the alumina layer of the substrate.

Water contact angles and coating thickness of the resultant self-assembled monolayer were determined on the coated sample using the procedures described above. The results appear in Table 1 (below).

Pentacene (available from Aldrich Chemical) was purified in a 3-zone furnace (Thermolyne 79500 tube furnace, from Barnstead Thermolyne, Dubuque, Iowa) at reduced pressure under a constant flow of nitrogen gas.

The purified pentacene was deposited by sublimation under vacuum (approximately $10^{6-}$ Torr (or $1.33 \times 10^{-4}$ Pa)) onto the self-assembled monolayer prepared surface at a rate of 0.5 Å per second to reach thickness of 500 Å as measured by a quartz crystal microbalance. Palladium or gold source and drain electrodes were then shadow masked onto the pentacene layer. The device dimensions were 40 μm channel length×1000 μm channel width.

Multiple OTFTs were prepared and a representative sample of 3 to 7 OTFTs were tested for each of seven deposition runs. The averaged results appear below in Table 2. Exceptional results occurred in single OTFTs with charge-carrier mobilities of around 3.7 cm²/Vs while the other values remained at or near the averages.

EXAMPLE 2–4

Examples 2–4 were prepared as in Example 1 with the precursor selection changing as listed. In Example 4, a 0.5 wt. % solution of the precursor was used.

In Example 2 (1-phosphono-3,7,11,15-tetramethylhexadecane), multiple OTFTs were prepared and a representative sample of 3 to 6 OTFTs was tested for each of 3 deposition runs. The averaged results appear below in Table 2.

Example 3 (1-phosphonooctane), multiple OTFTs were prepared and a representative sample of 1 to 4 OTFTs was tested for each of 6 deposition runs. The results appear below in Table 2.

Example 4 (1-phosphonohexane), multiple OTFTs were prepared and a representative sample of 3 OTFTs was tested for each of 3 deposition runs. The averaged pear below in Table 2.

Comparative Example 1

A silicon wafer substrate was cleaned using consecutive rinses of acetone, 2-propanol and de-ionized water, followed by heating for 3 minutes at 100° C. on a hot plate and a 15-minute exposure in a UV/ozone chamber (home-built). WCA was as in Examples 1–4 and the results appear in Table 1 (below).

Pentacene and source and drain electrodes were deposited as described in Examples 1–4. In Comparative Example 1 (no surface treatment), multiple OTFTs were prepared and a representative sample of 3 to 7 OTFTs was tested for each of 40 deposition runs. The averaged results appear below in Table 2.

TABLE 1

Thickness and Water Contact Angle

| Ex. | Precursor | Thickness (Å) | Static WCA | Advancing WCA | Receding WCA |
|---|---|---|---|---|---|
| 1 | 1-phosphonohexadecane | 19 | 109 | 116 | 103 |
| 2 | 1-phosphono-3,7,11,15-tetramethylhexadecane | 14 | 112 | 113 | 101 |
| 3 | 1-phosphonooctane | 7 | 106 | 112 | 100 |
| 4 | 1-phosphonohexane | 4 | 100 | 106 | 93 |
| CE1 | Al₂O₃ control | — | <40 | <40 | <40 |

TABLE 2

Performance

| Ex. | Precursor | Mobility (cm²/Vs) | Threshold Voltage (V) | Subthreshold Slope (V/decade) | On/Off Ratio |
|---|---|---|---|---|---|
| 1 | 1-phosphonohexadecane | 2.056 (0.89) | −4.86 (5.37) | 5.24 (6.86) | $2.38 \times 10^6$ |
| 2 | 1-phosphono-3,7,11,15-tetramethylhexadecane | 1.831 (0.72) | 5.40 (7.86) | 2.85 (1.29) | $4.52 \times 10^5$ |
| 3 | 1-phosphonooctane | 1.959 (0.36) | −1.93 (2.43) | 1.95 (0.77) | $3.57 \times 10^6$ |
| 4 | 1-phosphonohexane | 1.820 (0.57) | 1.11 (3.57) | 4.02 (4.21) | $1.80 \times 10^6$ |
| CE1 | Al₂O₃ control | 0.972 (0.35) | −6.72 (3.23) | 1.72 (0.86) | $8.74 \times 10^6$ |

In Table 2, the numbers in parentheses are the standard deviations.

For comparison, known devices treated with OTS have shown comparatively very high threshold voltages (above 60V), although OTFTs were still possible, as described in Jackson, et al., "Pentacene-Based Organic Thin Film Transistors," *IEEE Transactions on Electron Devices*, Vol. 44, pages 1325–31, 1997.

Various modifications and alterations of this invention will become apparent to those skilled in the art without departing from the scope and principles of this invention, and it should be understood that this invention is not to be unduly limited to the illustrative embodiments set forth hereinabove.

We claim:

1. An organic thin film transistor (OTFT) comprising a self-assembled monolayer interposed between a gate dielectric and an organic semiconductor layer, the monolayer being a product of a reaction between the gate dielectric and a precursor to the self-assembled monolayer, the precursor comprising a composition having the formula:

X—Y—Z$_n$, wherein X is H or CH₃;

Y is a linear or branched C₅–C₅₀ aliphatic or cyclic aliphatic connecting group, or a linear or branched C₈–C₅₀ group comprising an aromatic group and a C₃–C₄₄ aliphatic or cyclic aliphatic connecting group;

Z is selected from —PO₃H₂, —OPO₃H₂, benzotriazolyl (—C₆H₄N₃), carbonyloxybenzotriazole (—OC(=O)C₆H₄N₃), oxybenzotriazole (—O—C₆H₄N₃), aminobenzotriazole (—NH—C₆H₄N₃), —CONHOH, —COOH, —OH, —SH, —COSH, —COSeH, —C₅H₄N, —SeH, —SO₃H, —NC, —SiCl(CH₃)₂, —SiCl₂CH₃, amino, and phosphinyl;

and n is 1, 2, or 3 provided that n 1 when Z is —SiCl(CH₃)₂ or —SiCl₂CH₃.

2. The thin film transistor of claim 1 having a threshold voltage between about −25 and 25 volts, a subthreshold slope below about 10 volts per decade (absolute value), an on/off ratio of at least about 10⁴, and a charge-carrier mobility at least about 25% better than a comparison OTFT that lacks the self-assembled monolayer.

3. The thin film transistor of claim 1 having a threshold voltage between about −25 and 25 volts, a subthreshold slope below about 10 volts per decade (absolute value), an on/off ratio of at least about 10⁴, and a charge-carrier mobility at least about 50% better than a comparison OTFT that lacks the self-assembled monolayer.

4. The thin film transistor of claim 1 having a threshold voltage between about −25 and 25 volts, a subthreshold slope below about 10 volts per decade (absolute value), an on/off ratio of at least about 10⁴, and a charge-carrier mobility at least about 100% better than a comparison OTFT that lacks the self-assembled monolayer.

5. The thin film transistor of claim 1 comprising a gate dielectric that comprises an inorganic electrically insulating material.

6. The thin film transistor of claim 1 comprising a gate dielectric that comprises an inorganic electrically insulating material selected from strontiates, tantalates, titanates, zirconates, aluminum oxides, silicon oxides, tantalum oxides, titanium oxides, silicon nitrides, barium titanate, barium strontium titanate, barium zirconate titanate, zinc selenide, zinc sulfide, and alloys, and combinations, and multilayers thereof.

7. The thin film transistor of claim 1 further comprising a non-participating substrate.

8. The thin film transistor of claim 7 wherein the non-participating substrate is selected from inorganic glasses, ceramic foils, polymeric materials, filled polymeric materials, coated metallic foils, acrylics, epoxies, polyamides, polycarbonates, polyimides, polyketones, poly(ether ether ketone), polynorbornenes, polyphenyleneoxides, poly(ethylene naphthalenedicarboxylate), poly(ethylene terephthalate), poly(phenylene sulfide), and fiber-reinforced plastics.

9. The thin film transistor of claim 7 wherein the non-participating substrate is flexible.

10. The thin film transistor of claim 9 wherein the flexible substrate is capable of wrapping around the circumference of an about 10 cm diameter cylinder without breaking the substrate.

11. The thin film transistor of claim 9 wherein the flexible substrate may be rolled upon itself.

12. The thin film transistor of claim 1 comprising gate, source, and drain electrodes, each independently comprising a material selected from doped silicon, metal, and a conducting polymer.

13. The thin film transistor of claim 12 wherein the gate electrode comprises a material selected from aluminum, chromium, gold, silver, nickel, palladium, platinum, tantalum, titanium, polyaniline, poly(3,4-oxyethyleneoxythiophene)/poly(styrene sulfonate), alloys thereof, combinations thereof, and multilayers thereof.

14. The thin film transistor of claim 12 wherein the source and/or drain electrode(s) are selected from aluminum, barium, calcium, chromium, gold, silver, nickel, palladium, platinum, titanium, polyaniline, poly(3,4-ethylenedioxythiophene)/poly(styrene sulfonate), alloys thereof, combinations thereof, and multilayers thereof.

15. The thin film transistor of claim 1 wherein Y is selected from a saturated aliphatic group, an unsaturated aliphatic group, a saturated cyclic aliphatic group, and an unsaturated cyclic aliphatic group, or a combination thereof, each of which may be linear or branched.

16. The thin film transistor of claim 1 wherein the monolayer precursor comprises a composition selected from CH₃—(CH₂)ₘ—PO₃H₂, wherein m is an integer from 4 to 21.

17. The thin film transistor of claim 1 wherein the monolayer precursor comprises a composition selected from 1-phosphonohexane, 1-phosphonooctane, 1-phosphonohexadecane, and 1-phosphono-3,7,11,15-tetramethylhexadecane.

18. The thin film transistor of claim 1 wherein the organic semiconductor layer comprises a material selected from acenes, perylenes, fullerenes, phthalocyanines, and oligothiophenes.

19. The thin film transistor of claim 1 wherein the organic semiconductor layer comprises pentacene.

20. An integrated circuit comprising a multiplicity of the thin film transistors according to claim 1.

21. An integrated circuit comprising a multiplicity of the thin film transistors of claim 1 on a non-participating substrate, which optionally is flexible.

22. A composition comprising 1-phosphono-3,7,11,15-tetramethylhexadecane.

23. A method of making an organic thin film transistor comprising:
  a) providing a substrate;
  b) providing a gate electrode material on the substrate;
  c) providing a gate dielectric on the gate electrode material;
  d) providing a self-assembled monolayer adjacent to the gate dielectric, the monolayer being a product of a reaction between the gate dielectric and a precursor to the self-assembled monolayer, the precursor comprising a composition having the formula:

wherein X is H or CH₃; Y is a linear or branched C₅–C₅₀ aliphatic or cyclic aliphatic connecting group, or a linear or branched C₈–C₅₀ group comprising an aromatic group and a C₃–C₄₄ aliphatic or cyclic aliphatic connecting group; Z is selected from —PO₃H₂, —OPO₃H₂, benzotriazolyl (—C₆H₄N₃), carbonyloxybenzotriazole (—OC(=O)C₆H₄N₃), oxybenzotriazole (—O—C₆H₄N₃), aminobenzotriazole (—NH—C₆H₄N₃), —CONHOH, —COOH, —OH, —SH, —COSH, —COSeH, —C₅H₄N, —SeH, —SO₃H, —NC, —SiCl(CH₃)₂, —SiCl₂CH₃, amino, and phosphinyl; and n is 1, 2, or 3 provided that n=1 when Z is —SiCl(CH₃)₂ or —SiCl₂CH₃;
  e) providing an organic semiconductor layer adjacent to the monolayer; and
  f) providing a source electrode and a drain electrode contiguous to the organic semiconductor layer.

24. The method of claim 23 wherein the steps are performed in the order listed.

25. The method of claim 23 wherein the step of providing a self-assembled monolayer involves a coating process selected from spray, spin, dip, gravure, microcontact printing, ink jet printing, stamping, transfer printing, and vapor deposition.

26. The method of claim 23 wherein the source and drain electrodes are provided adjacent to the gate dielectric before the step of providing a self-assembled monolayer on the gate dielectric.

27. The method of claim 23 wherein an excess of the precursor is provided in step (d), followed by allowing sufficient time for interaction which may be instantaneous, and removing excess precursor.

28. The method of claim 23 wherein the substrate is flexible.

29. The method of claim 23 wherein the substrate is selected from inorganic glasses, ceramic foils, polymeric materials, filled polymeric materials, coated metallic foils, acrylics, epoxies, polyamides, polycarbonates, polyimides, polyketones, poly(ether ether ketone), polynorbornenes, polyphenyleneoxides, poly(ethylene naphthalenedicarboxylate), poly(ethylene terephthalate), poly(phenylene sulfide), and fiber-reinforced plastics.

30. The method of claim 23 carried out in its entirety below a peak substrate temperature of 250° C.

31. The method of claim 23 carried out in its entirety below a peak substrate temperature of 150° C.

32. The method of claim 23 carried out in its entirety below a peak temperature of 70° C.

33. The method of claim 23 carried out on a web.

34. An integrated circuit comprising a plurality of thin film transistors made by the method of claim 23.

* * * * *

UNITED STATES PATENT AND TRADEMARK OFFICE
CERTIFICATE OF CORRECTION

PATENT NO. : 6,433,359 B1
DATED : August 13, 2002
INVENTOR(S) : Kelley, Tommie W.

It is certified that error appears in the above-identified patent and that said Letters Patent is hereby corrected as shown below:

Column 8,
Line 60, following "$\Delta_s$" delete ",".

Column 9,
Line 45, delete "($V_g$," and insert in place thereof -- ($V_g$), --.

Column 10,
Line 7, following "monolayer" insert -- precursor --.

Column 11,
Line 21, delete "$10^{6-}$" and insert in place therefor -- $10^{-6}$ --.
Lines 45 and 49, preceding "Example" insert -- In --.
Line 47, following "The" insert -- averaged --.
Line 51, delete "pear" and insert in place thereof -- results appear --.
Line 57, following "acetone," insert -- methanol, --.

Column 13,
Line 3, delete "n 1" and insert in place thereof -- n=1 --.

Signed and Sealed this

Twenty-sixth Day of July, 2005

JON W. DUDAS
*Director of the United States Patent and Trademark Office*